US011095117B2

(12) United States Patent
Strouse et al.

(10) Patent No.: US 11,095,117 B2
(45) Date of Patent: Aug. 17, 2021

(54) DC-DC CONVERTERS HAVING DIN RAIL MOUNTS

(71) Applicant: VERTIV ENERGY SYSTEMS, INC., Lombard, IL (US)

(72) Inventors: Timothy Brooklyn Strouse, Lombard, IL (US); Michael Francis Smith, Columbia Station, OH (US); Paul Brian Hiidel, Lombard, IL (US)

(73) Assignee: Vertiv Corporation, Lombard, IL (US)

( * ) Notice: Subject to any disclaimer, the term of this patent is extended or adjusted under 35 U.S.C. 154(b) by 14 days.

(21) Appl. No.: 16/515,832

(22) Filed: Jul. 18, 2019

(65) Prior Publication Data

US 2020/0028352 A1    Jan. 23, 2020

Related U.S. Application Data

(60) Provisional application No. 62/701,114, filed on Jul. 20, 2018.

(51) Int. Cl.
*H02H 7/12*    (2006.01)
*H05K 7/14*    (2006.01)
(Continued)

(52) U.S. Cl.
CPC ......... *H02H 7/1213* (2013.01); *H05K 7/1457* (2013.01); *H02B 1/052* (2013.01); *H02H 7/20* (2013.01); *H02M 3/00* (2013.01)

(58) Field of Classification Search
CPC .. H05K 5/0204; H05K 7/1427; H05K 7/1432; H05K 7/1447; H05K 7/1451;
(Continued)

(56) References Cited

U.S. PATENT DOCUMENTS 4,900,275 A * 2/1990 Fasano ................... H02B 1/052
439/716
5,635,827 A * 6/1997 Judd ...................... H02B 1/052
323/321
(Continued)

FOREIGN PATENT DOCUMENTS

EP    1160952 A2    12/2001
GB    2503479 A    1/2014
(Continued)

*Primary Examiner* — Fred E Finch, III
(74) *Attorney, Agent, or Firm* — Harness, Dickey & Pierce, P.L.C.

(57) ABSTRACT

Example DC-DC power distribution systems include electronic communication device(s), a circuit breaker DIN rail adapted to receive a circuit breaker for providing electrical protection to the one or more electronic communication devices, and a DC-DC converter including a housing having a DIN rail mount, a voltage input and a voltage output. The DC-DC converter includes a DC-DC voltage converter circuit coupled between the voltage input and the voltage output, and a controller electrically coupled with the DC-DC voltage converter circuit. The DC-DC converter is mounted on the circuit breaker DIN rail via the DIN rail mount of the DC-DC converter housing, and the controller is configured to control the DC-DC voltage converter circuit to convert a DC voltage at the voltage input to a different DC voltage at the voltage output to supply power to the one or more electronic communication devices.

20 Claims, 3 Drawing Sheets

(51) Int. Cl.
*H02H 7/20* (2006.01)
*H02M 3/00* (2006.01)
*H02B 1/052* (2006.01)

(58) Field of Classification Search
CPC .. H05K 7/1457; H05K 7/1485; H05K 7/1489;
H05K 7/1492; H05K 7/183; H05K 7/186;
H02B 1/052; H02B 1/0523; H02B
1/0526; H02B 1/34; H02B 1/36; H02H
3/08; H02H 3/087; H02H 7/1213; H02H
7/20; H02H 7/22; H02M 1/32; H01H
71/0264; H01H 71/0271; H04Q 1/03;
H04Q 1/032
See application file for complete search history.

(56) References Cited

U.S. PATENT DOCUMENTS

| | | | | |
|---|---|---|---|---|
| 6,062,914 | A * | 5/2000 | Fasano | H01H 71/08 361/634 |
| 7,043,543 | B2 * | 5/2006 | Ewing | H02B 1/34 |
| 7,466,038 | B2 * | 12/2008 | Gaudreau | H02J 1/102 307/82 |
| 8,415,831 | B1 * | 4/2013 | Hayes, Jr. | H05K 7/1492 307/66 |
| 8,625,748 | B2 | 1/2014 | Kioski et al. | |
| 8,848,346 | B2 | 9/2014 | Johnsen | |
| 2001/0046144 | A1 * | 11/2001 | Murabayashi | H05K 7/1432 363/69 |
| 2002/0064017 | A1 * | 5/2002 | Karol | H05K 7/209 361/274.3 |
| 2003/0188221 | A1 * | 10/2003 | Rasmussen | G05B 19/0428 714/11 |
| 2004/0140718 | A1 * | 7/2004 | Wise, Jr. | H02J 1/108 307/75 |
| 2004/0252421 | A1 * | 12/2004 | Knox, Jr. | H01R 11/03 361/23 |
| 2005/0226013 | A1 * | 10/2005 | Fontana | H02M 3/155 363/65 |
| 2006/0082222 | A1 * | 4/2006 | Pincu | G06F 1/3287 307/29 |
| 2008/0122289 | A1 * | 5/2008 | Best | H05K 7/1457 307/25 |
| 2010/0020475 | A1 * | 1/2010 | Spitaels | H01R 13/6666 361/656 |
| 2010/0237699 | A1 * | 9/2010 | Gibson | H04Q 1/03 307/39 |
| 2012/0019987 | A1 * | 1/2012 | Barreau | H05K 5/0021 361/673 |
| 2013/0077258 | A1 * | 3/2013 | Bravo | H02B 1/063 361/724 |
| 2014/0015321 | A1 * | 1/2014 | Nordin | H02J 1/001 307/43 |
| 2014/0159552 | A1 * | 6/2014 | Bravo | H02G 3/086 312/198 |
| 2015/0077042 | A1 * | 3/2015 | Seidel | H05K 7/1432 320/107 |
| 2015/0236507 | A1 * | 8/2015 | Burant | H02J 3/0073 307/23 |
| 2015/0245531 | A1 * | 8/2015 | Meinecke | H05K 7/1489 361/679.02 |
| 2016/0006223 | A1 * | 1/2016 | Sinistro | H02B 7/06 361/622 |
| 2016/0006300 | A1 * | 1/2016 | Grujovski | H02J 13/00034 307/64 |
| 2017/0077709 | A1 | 3/2017 | Kim et al. | |
| 2017/0117700 | A1 * | 4/2017 | Idota | H01R 31/06 |
| 2017/0338649 | A1 * | 11/2017 | Barcey | H02H 9/045 |
| 2018/0097340 | A1 * | 4/2018 | Lee | H02H 3/20 |
| 2018/0151318 | A1 * | 5/2018 | Kamensek | H01C 7/126 |
| 2018/0198247 | A1 * | 7/2018 | Klein | H02B 1/26 |
| 2018/0261994 | A1 * | 9/2018 | Easton | H01H 83/02 |
| 2018/0270985 | A1 * | 9/2018 | Shiraga | G06F 1/26 |
| 2018/0294641 | A1 * | 10/2018 | Strouse | H02J 9/061 |
| 2019/0393640 | A1 * | 12/2019 | Steinberger | H01R 13/447 |
| 2020/0028352 | A1 * | 1/2020 | Strouse | H02M 3/08 |
| 2020/0050753 | A1 * | 2/2020 | Davis | G06F 21/6218 |

FOREIGN PATENT DOCUMENTS

| | | |
|---|---|---|
| JP | 2014171313 A | 9/2014 |
| JP | 2015012786 A | 1/2015 |
| KR | 20090043462 A | 5/2009 |
| KR | 101642761 B1 | 8/2016 |
| KR | 20180076897 A | 7/2018 |

\* cited by examiner

DC-DC CONVERTERS HAVING DIN RAIL MOUNTS

CROSS-REFERENCE TO RELATED APPLICATIONS

This application claims the benefit and priority of U.S. Provisional Application No. 62/701,114 filed on Jul. 20, 2018. The entire disclosure of the above application is incorporated herein by reference.

FIELD

The present disclosure relates to DC-DC converters having DIN rail mounts and methods of converting DC voltages using DC-DC converters having DIN rail mounts.

BACKGROUND

This section provides background information related to the present disclosure which is not necessarily prior art.

Wireless service providers use power radio equipment located on radio towers at various heights. Due to a cable loop length from a power system to the radio equipment, a DC voltage at the radio equipment is reduced, and the DC voltage also decreases during an AC outage (due to battery discharge). Wireless providers often deploy a stand-alone DC-DC converter system connected to an existing −48VDC rectifier/battery plant to increase the DC output voltage to the radio equipment to allow the radio equipment to sustain operation during an outage, and to reduce the size of the cable feeding the remote radio equipment. In addition, distributed antenna system (DAS) providers sometimes deploy a stand-alone Class 2 circuit converter system that limits each circuit to 100 W. However, the installation of stand-alone converter systems requires considerable extra expense as well as extra rack space.

SUMMARY

This section provides a general summary of the disclosure, and is not a comprehensive disclosure of its full scope or all of its features.

According to one aspect of the present disclosure, a DC-DC power distribution systems includes one or more electronic communication devices, a circuit breaker DIN rail adapted to receive a circuit breaker for providing electrical protection to the one or more electronic communication devices, and a DC-DC converter including a housing having a DIN rail mount, a voltage input and a voltage output. The DC-DC converter includes a DC-DC voltage converter circuit coupled between the voltage input and the voltage output, and a controller electrically coupled with the DC-DC voltage converter circuit. The DC-DC converter is mounted on the circuit breaker DIN rail via the DIN rail mount of the DC-DC converter housing, and the controller is configured to control the DC-DC voltage converter circuit to convert a DC voltage at the voltage input to a different DC voltage at the voltage output to supply power to the one or more electronic communication devices.

According to another aspect of the present disclosure, a method of supplying power in a DC-DC power distribution system is disclosed. The DC-DC power distribution system includes one or more electronic communication devices, a circuit breaker DIN rail, and a DC-DC converter including a housing having a DIN rail mount, a voltage input and a voltage output. The DC-DC converter includes a DC-DC voltage converter circuit coupled between the voltage input and the voltage output, and a controller coupled with the DC-DC voltage converter circuit. The DC-DC converter is mounted on the circuit breaker DIN rail via the DIN rail mount of the DC-DC converter housing. The method includes receiving, at the voltage input of the DC-DC converter mounted on the circuit breaker DIN rail, a DC input voltage. The method also includes converting, by the DC-DC voltage converter circuit, the received DC input voltage to a different DC output voltage, and supplying, via the voltage output of the DC-DC converter mounted on the circuit breaker DIN rail, the converted DC output voltage to the one or more electronic communication devices According to yet another aspect of the present disclosure, a DC-DC converter includes a housing having a DIN rail mount, a voltage input and a voltage output. The DIN rail mount is adapted to mount on a circuit breaker DIN rail of a DC-DC power distribution system. The DC-DC converter also includes a DC-DC voltage converter circuit coupled between the voltage input and the voltage output, and a controller coupled with the DC-DC voltage converter circuit. The controller is configured to control the DC-DC voltage converter circuit to convert a DC voltage received at the voltage input to a different DC voltage at the voltage output, to supply output power at the DC output voltage.

Further aspects and areas of applicability will become apparent from the description provided herein. It should be understood that various aspects and features of this disclosure may be implemented individually or in combination with one or more other aspects or features. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding features throughout the several views of the drawings.

DETAILED DESCRIPTION

Figure 1:
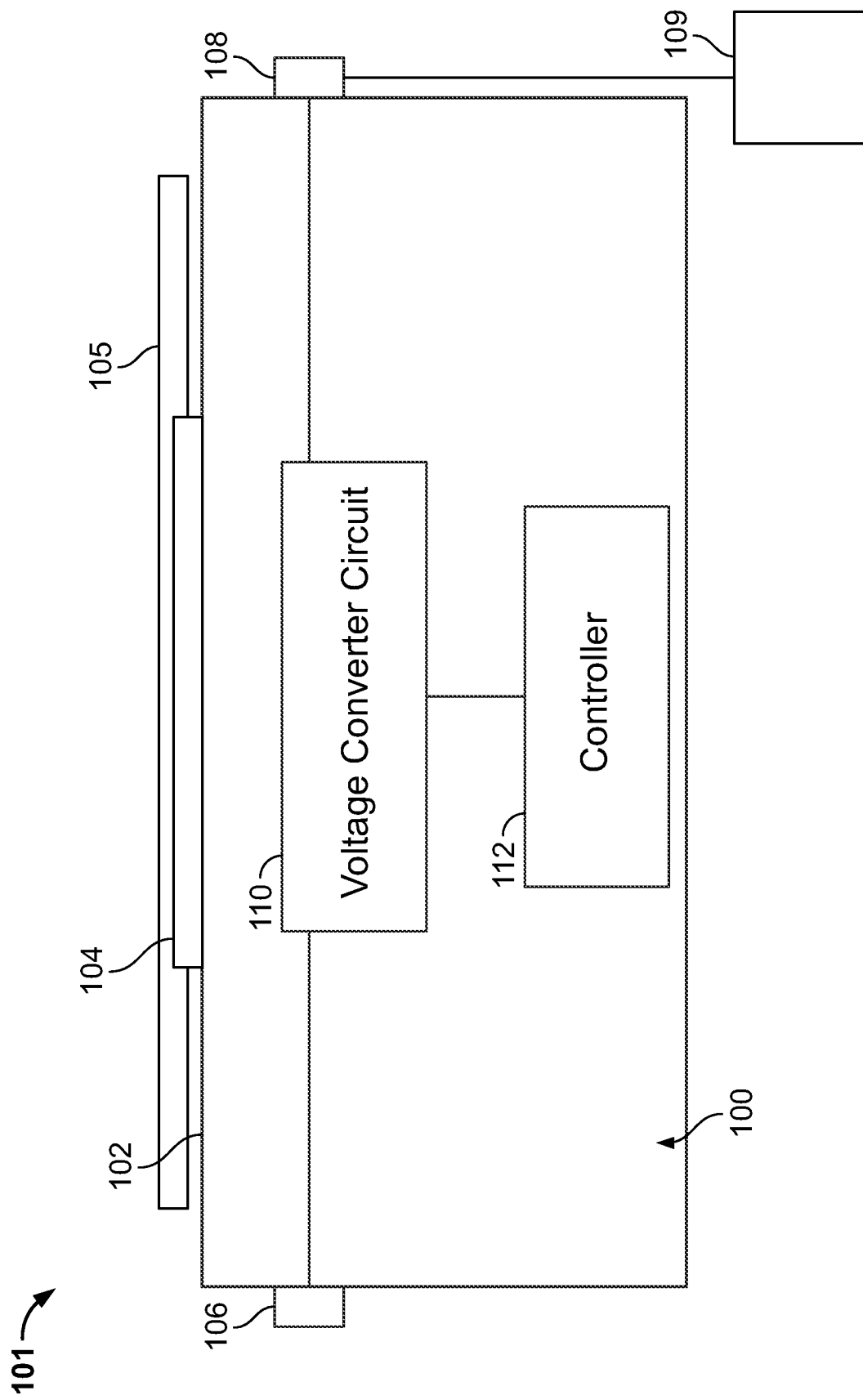
FIG. 1 is a block diagram of a DC-DC power distribution system according to one example embodiment of the present disclosure.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

A DC-DC power distribution system according to one example embodiment of the present disclosure is illustrated in FIG. 1 and indicated generally by reference number 101. As shown in FIG. 1, the DC-DC power distribution system includes one or more electronic communication devices 109, a circuit breaker DIN rail 105 adapted to receive a circuit breaker (not shown) for providing electrical protection to the one or more electronic communication devices 109, and a DC-DC converter 100.

The DC-DC converter 100 includes a housing 102 having a DIN rail mount 104, a voltage input 106 and a voltage output 108. The DIN rail mount 104 is adapted to mount on the circuit breaker DIN rail 105 of the DC-DC power distribution system 101.

The DC-DC converter 100 further incudes a DC-DC voltage converter circuit 110 coupled between the voltage input 106 and the voltage output 108, and a controller 112 coupled with the DC-DC voltage converter circuit 110. The controller 112 is configured to control the DC-DC voltage converter circuit 110 to convert a DC voltage at the voltage input 106 to a different DC voltage at the voltage output 108.

For example, if the voltage input 106 is an input terminal (e.g., DIN style line terminal, etc.) and the voltage output 108 is an output terminal (e.g., DIN style load terminal, etc.), the DC-DC voltage converter circuit 110 may convert a DC voltage received at the voltage input 106 to a different DC voltage at the voltage output 108. The voltage output 108 may supply the converted DC output voltage to the one or more electronic devices 109.

As described above, the DIN rail mount 104 is adapted to mount on the circuit breaker DIN rail 105 of the DC-DC power distribution system 101. For example, the DIN rail mount 104 may be sized, spaced, etc. substantially the same as a DIN rail DC circuit breaker. As used herein, a "DIN rail DC circuit breaker" may refer to any circuit breaker having a DIN rail mount, any fuse having a DIN rail mount, etc., that is configured to mount to a DIN rail in a DC power system.

In some cases, the housing 102 may have substantially the same form factor as a DIN rail DC circuit breaker. For example, the housing 102 may have the same shape as a DIN rail DC circuit breaker, the same size as a DIN rail DC circuit breaker (e.g., occupying a single DIN rail device pole/location, multiple DIN rail device poles/locations), etc. Therefore, the housing 102 and DIN rail mount 104 form a DC-DC converter package that can mount on the circuit breaker DIN rail 105 of the DC-DC power distribution system 101. The circuit breaker DIN rail 105 may at least a portion of a circuit breaker panel of the DC-DC power distribution system 101.

The DIN rail mount 104 may be adapted to mount on any suitable DIN rail, including a top hat section rail, a type O rail, a type omega rail, a C section rail, a G section rail, etc. For example, the DIN rail mount 104 may be adapted to mount to a DIN rail having a width of 15 mm, 35 mm, 75 mm, etc., to a DIN rail having a depth of 5.5 mm, 7.5 mm, 15 mm, etc. The DIN rail mount 104 may include one or more clips, protrusions, clasps, etc. configured to mount the housing 102 to the DIN rail. For example, the DIN rail mount 104 may releasably snap onto a DIN rail, clip onto a DIN rail via rotation of the DIN rail mount 104, etc.

The voltage input 106 and the voltage output 108 may include any suitable terminal, connector, wire, lead, etc. for transmitting power. For example, the circuit breaker DIN rail 105 may form part of a DC circuit breaker panel in the DC-DC power distribution system 101, and the voltage input 106 and voltage output 108 may include a DIN style line terminal and a DIN style load terminal for connecting the DC-DC converter 100 to DIN line and load leads associated with the circuit breaker DIN rail 105 and DC circuit breaker panel, for supplying power to one or more electronic devices 109.

The one or more electronic devices 109 may include any suitable electronic devices, including electronic communication (e.g., telecommunications) equipment. The one or more electronic devices 109 may include devices that actually perform communication functions, other devices that support and/or facilitate communication, etc., such as radios, antennas, transmitters, switched-mode power supplies, batteries, rectifiers, etc.

The DC-DC voltage converter circuit 110 may comprise any suitable DC-DC converter topology such as a switching power supply (e.g., a switched-mode power supply (SMPS)). The DC-DC voltage converter circuit 110 can include one or more switches, one or more diodes, one or more capacitors, a transformer, etc. The controller 112 may be configured to control switching operation of the DC-DC voltage converter circuit 110.

The DC-DC voltage converter circuit 110 may be configured to convert a DC input voltage within any suitable specified voltage input range, to a DC output voltage within any suitable specified voltage output range. For example, in some embodiments the specified DC voltage input range is about −36VDC to −58VDC. In this case, the DC-DC voltage converter circuit 110 may convert the DC voltage input to a DC voltage output range of about −48V to −72VDC.

In other embodiments, the DC-DC voltage converter circuit 110 may receive a positive DC input voltage at the voltage input 106 and provide a positive DC output voltage at the voltage output 108, may receive a positive DC input voltage at the voltage input 106 and provide a negative DC output voltage at the voltage output 108, may receive a negative DC input voltage at the voltage input 106 and provide a positive DC output voltage at the voltage output 108, etc. The DC-DC voltage converter circuit 110 may receive, convert and provide DC voltages outside of the ranges listed above.

Figure 2:
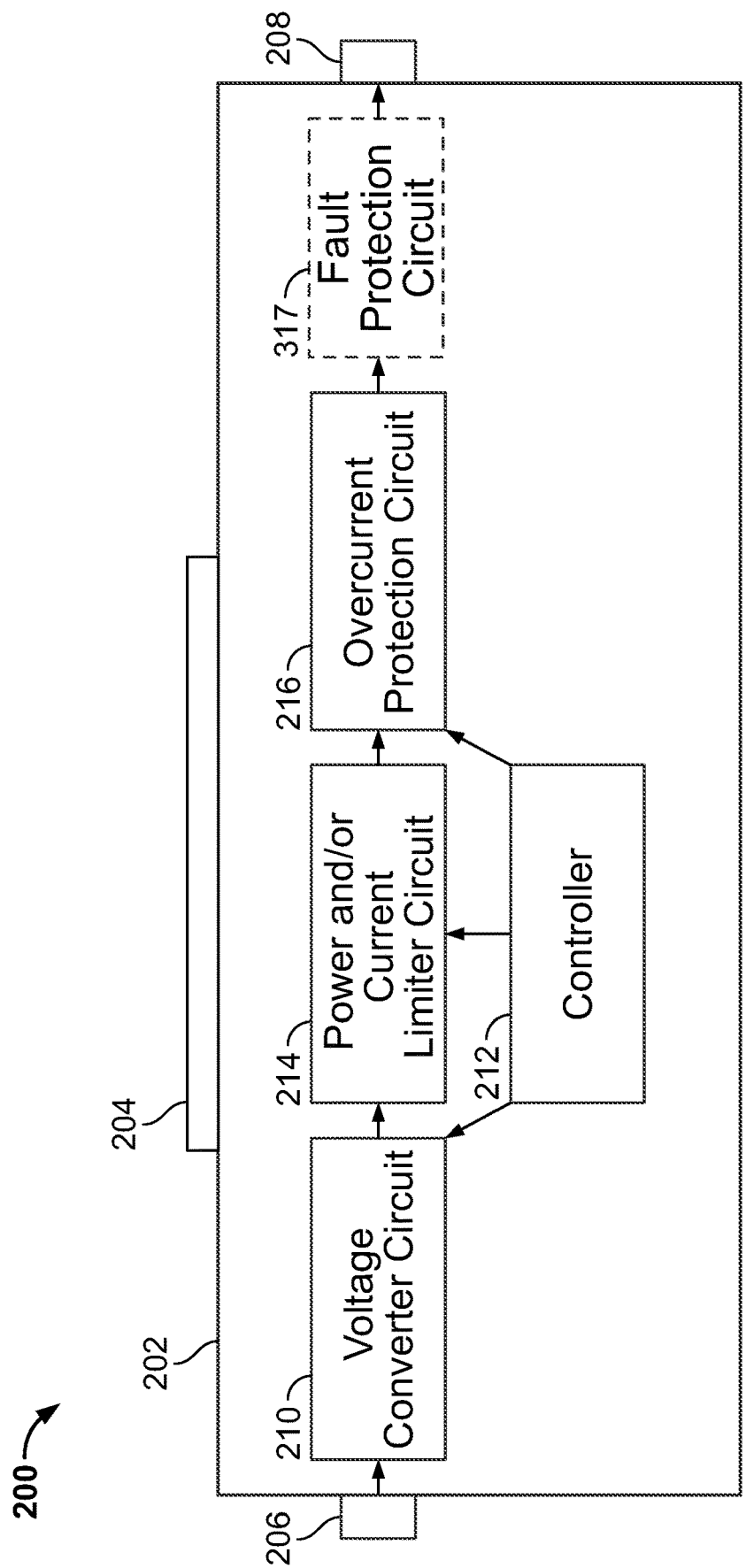
FIG. 2 is a block diagram of a DC-DC converter having a power and/or current limiter circuit and an overcurrent protection circuit according to another example embodiment of the present disclosure.

FIG. 2 illustrates a DC-DC converter 200 according to another example embodiment of the present disclosure. The DC-DC converter 200 includes a housing 202 having a DIN rail mount 204, a voltage input 206 and a voltage output 208.

The housing 202 and the DIN rail mount 204 may form a DC-DC converter package that can mount on a circuit breaker DIN rail of a DC power system (e.g., the circuit breaker DIN rail 105 of the DC-DC power distribution system 101 of FIG. 1, etc.). For example, a DC power distribution system may include a DIN rail for mounting DIN rail DC circuit breakers, and the DIN rail mount 204 of the DC-DC converter 200 may be mounted to the circuit breaker DIN rail of the DC power distribution system (e.g., as shown in the DC-DC power distribution system 101 illustrated in FIG. 1, etc.).

The DC-DC converter 200 also includes a DC-DC voltage converter circuit 210 coupled between the voltage input 206 and the voltage output 208, and a controller 212 coupled with the DC-DC voltage converter circuit 210. The controller 212 is configured to control the DC-DC voltage converter circuit 210 to convert a DC voltage.

As shown in FIG. 2, the DC-DC converter 200 includes a power and/or current limiter circuit 214 coupled between the voltage input 206 and the voltage output 208 to limit a DC output power and/or DC output current of the DC-DC converter 200. For example, the power and/or current limiter circuit 214 may be configured to limit a DC output power at the voltage output 208 to below a specified output power threshold, to limit a DC output current at the voltage output 208 to below a specified output current threshold, to limit both the DC output power and the DC output current, etc.

The power and/or current limiter circuit 214 may include any suitable power and/or current limiting circuit topology (e.g., an inrush current limiter, etc.). The power and/or current limiter circuit 214 can include one or more resistors, switches, diodes, negative temperature coefficient (NTC) thermistors, etc.

The DC-DC converter 200 further includes an overcurrent protection circuit 216 coupled between the voltage input 206 and the voltage output 208 to protect the DC-DC converter 200 from an overcurrent condition. For example, the overcurrent protection circuit 216 may be configured to inhibit the DC output current at the voltage output 208 from exceeding an overcurrent condition threshold that could damage the DC-DC converter 200.

The overcurrent protection circuit 216 may include any suitable overcurrent protection circuit topology. For example, the overcurrent protection circuit 216 can include one or more circuit breakers, fuses, resistors, switches, diodes, etc.

In addition to primary overcurrent protection provided by the overcurrent protection circuit 216, the DC-DC converter 200 may include a backup overcurrent function (e.g., a backup overcurrent protection circuit, switch, etc.). The backup overcurrent function can create a physical disconnect (e.g., an air gap, etc.) between the voltage input 206 and voltage output 208 in the event the overcurrent protection circuit 216 is not adequate to sufficiently limit the output current (e.g., when the output current exceeds a current limit threshold of the overcurrent protection circuit 216, etc.).

Although FIG. 2 illustrates one power and/or current limiter circuit 214 and a separate overcurrent protection circuit 216, other embodiments may combine a power limiter circuit, a current limiter circuit and an overcurrent protection circuit into a single circuit. Alternatively, the power limiter circuit, the current limiter circuit and the overcurrent protection circuit may each be separate from one another. In some cases, a DC-DC converter may include only one or two of the power limiter circuit, the current limiter circuit and the overcurrent protection circuit, which may be combined or separate from one another.

As mentioned above, the DC-DC converter 200 includes a controller 212. The controller 212 is illustrated as coupled with the DC-DC voltage converter circuit 210, the power or current limiter circuit 214 and the overcurrent protection circuit 216. However, in other embodiments the controller 212 may be coupled with only one or two of the DC-DC voltage converter circuit 210, the power or current limiter circuit 214 and the overcurrent protection circuit 216.

The controller 212 is configured to operate the power and/or current limiter circuit 214 to limit a DC output power or DC output current of the DC-DC converter 200 to below a specified output power threshold or specified output current threshold. For example, the controller 212 may be configured to control the power or current limiter circuit 214 to limit a DC output power of the DC-DC converter 200 to below a specified output power threshold in a range of about 100 W to about 2500 W.

Alternatively, or in addition, the controller 212 may be configured to control the power and/or current limiter circuit 214 to limit a DC output current of the DC-DC converter 200 to below a specified output current threshold value in a range of about 1 A to about 50 A. In other embodiments, the power and/or current limiter circuit 214 may limit a DC output power or current to below threshold values outside the range listed above.

Although FIG. 2 illustrates the controller 212 coupled with the power and/or current limiter circuit 214 to operate the power and/or current limiter circuit 214, in other embodiments the power and/or current limiter circuit 214 may be separate from the controller 212 (i.e., not coupled with the controller 212), the power and/or current limiter circuit 214 may operate without receiving any control signals from the controller 212, etc.

The controller 212 is configured to control the overcurrent protection circuit 216 to protect the DC-DC converter 200 from an overcurrent condition. For example, the controller 212 may be configured to control the overcurrent protection circuit 216 to inhibit the DC output current at the voltage output 208 from exceeding an overcurrent condition threshold that could damage the DC-DC converter 200.

As one example, the overcurrent protection circuit 216 may limit a DC output current of the DC-DC converter 200 to below a threshold value in a range of about 1 A to about 50 A. In other embodiments, the overcurrent protection circuit 216 may limit a DC output current to below threshold values outside the range listed above.

As described above, in addition to the primary overcurrent protection provided by the overcurrent protection circuit 216, the DC-DC converter 200 may include a backup overcurrent function (e.g., backup overcurrent protection circuit, switch, etc.) that creates an air gap between the voltage terminals 206 and 208 in the event the primary overcurrent protection provided by the overcurrent protection circuit 216 is not adequate to sufficiently limit the DC output current.

Although FIG. 2 illustrates the controller 212 coupled with the overcurrent protection circuit 216 to operate the overcurrent protection circuit 216, in other embodiments the overcurrent protection circuit 216 may be separate from the controller 212 (i.e., not coupled with the controller 212), the overcurrent protection circuit 216 may operate without receiving any control signals from the controller 212, etc.

As described herein, the controller 212 may be configured to perform operations using any suitable combination of hardware and software. For example, the controller 212 may include any suitable circuitry, logic gates, microprocessor(s), computer-executable instructions stored in memory, etc. operable to cause the controller 212 to perform actions described herein (e.g., operating the DC-DC voltage converter circuit 210, etc.).

In some embodiments, operation parameters of the DC-DC converter 200 may be adjustable by a user. For example, the user may be able to set one or more voltage values of the DC-DC voltage converter circuit 210 (e.g., voltage input values, voltage output values, voltage conversion values, etc.), a DC output power or current limit threshold value of the power and/or current limiter circuit 214, an overcurrent condition threshold value of the overcurrent protection circuit 216, etc.

These values may be set or adjusted prior to operation of the DC-DC converter 200, during operation of the DC-DC converter 200, etc. The values may be set or adjusted manually via input(s) on the housing 202 of the DC-DC converter 200, via a computing device coupled to the controller 212 of the DC-DC converter 200 via a wired and/or wireless connection, etc.

Figure 3:
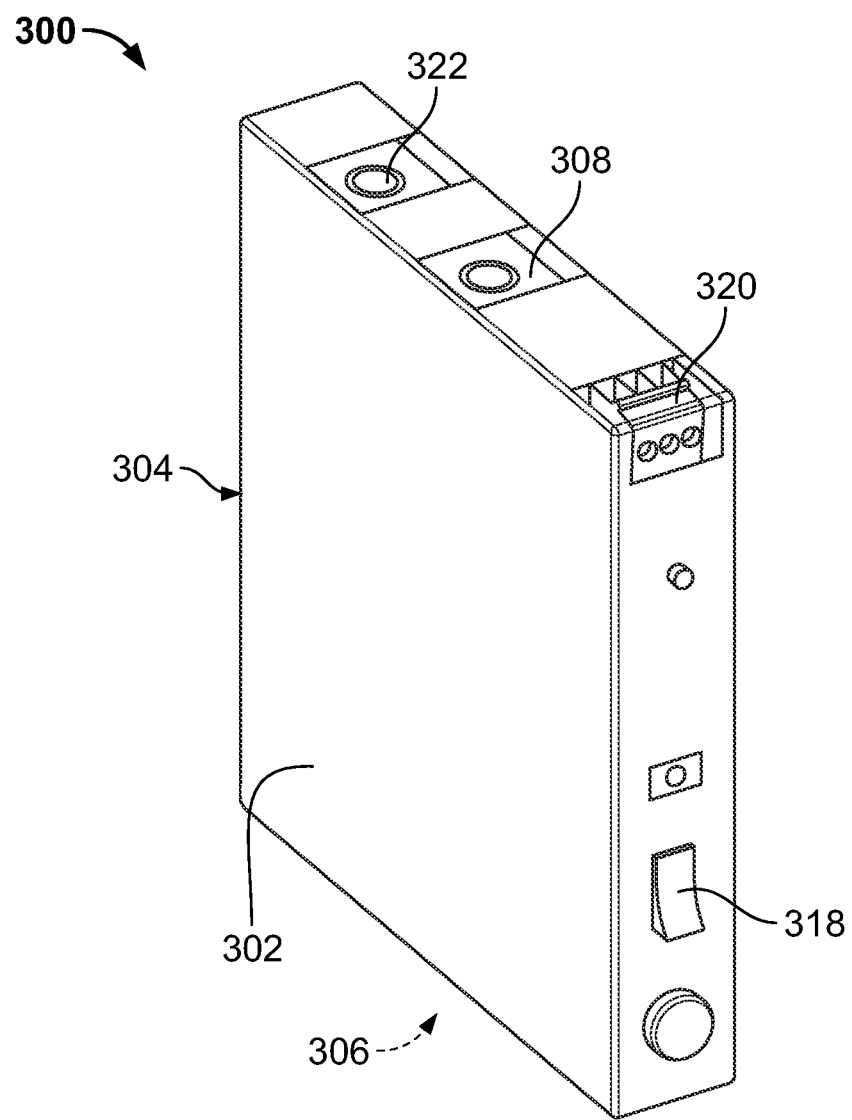
FIG. 3 is a perspective view of a DC-DC converter housing, according to another example embodiment of the present disclosure.

FIG. 3 illustrates one example of an optional housing 302 of a DC-DC converter 300 according to another example embodiment of the present disclosure. As shown in FIG. 3, the housing 302 is a DIN rail DC circuit breaker housing. The housing 302 includes a DIN rail mount 304 a voltage input 306 and a voltage output 308. Each of the voltage input 306 and the voltage output 308 may be one of a DIN rail style line terminal, a DIN rail style load terminal, etc. In FIG. 3, the voltage input 306 located on the underside of the housing 302 is not shown.

The DC-DC converter 300 may be similar to the DC-DC converter 100 and 200 of FIGS. 1 and 2. For example, the housing 302 of FIG. 3 may enclose one or more of the DC-DC voltage converter circuits 110 and 210, the power and/or current limiter circuit 214, the overcurrent protection circuit 216 and the controllers 112 and 212 illustrated in FIGS. 1 and 2.

The housing 302 includes a switch 318 (e.g., a toggle handle, a toggle switch, an on/off switch, an enable/disable switch, etc.). The switch 318 may be used to turn on and/or turn off the DC-DC converter 300, to reset the DC-DC converter 300 in the event that the DC-DC converter 300 trips due to a fault (e.g., an overcurrent condition, exceeding a power limit condition, etc.), etc.

For example, the DC-DC converter 300 may include one or more fault protection circuits 317 coupled between the voltage input 306 and the voltage output 308 (as shown in FIG. 2). In the event that the fault protection circuit 317 detects a fault condition of the DC-DC converter 300, experiences a fault condition, etc., the fault protection circuit 317 can disable the DC-DC converter 300 (e.g., to disconnect the voltage input 306 from the voltage output 308 to create an open circuit).

The DC-DC converter 300 may include a low-voltage disconnect capability. For example, a controller (e.g., the controller 112 of FIG. 1, etc.) of the DC-DC converter 300 may be configured to sense, detect, etc. a low-voltage condition of the DC-DC converter 300 (e.g., when a DC voltage input or DC voltage output of the DC-DC converter 300 drops below a low-voltage condition threshold). In this case, the controller can disconnect the voltage input 306 from the voltage output 308 (e.g., by opening a circuit).

The DC-DC converter 300 can include any suitable current sense for sensing, detecting, etc. a DC input current or a DC output current of the DC-DC converter 300. Similarly, the DC-DC converter 300 can include any suitable voltage sense for sensing, detecting, etc. a voltage supplied to the DC-DC converter 300 from an external source (e.g., a remote radio input voltage on sense leads connected to the DC-DC converter 300, etc.).

For example, the voltage sense may sense a DC input voltage or a DC output voltage of the DC-DC converter 300. In these cases, the current sense or voltage sense may be coupled to the controller to provide sensed current or voltage values to the controller, and the controller may use the sensed value(s) to adjust the DC output voltage of the DC-DC converter 300.

In some embodiments, a controller (e.g., the controller 112 of FIG. 1, etc.) of the DC-DC converter 300 may be configured to receive a manual on/off input. For example, the switch 318 may provide a manual on/off input to the controller. In other embodiments, the housing 302 may have a separate switch, button, etc. for manual on/off input.

In these cases, the controller can be configured to operate the DC-DC converter 300 according to the manual on/off input (e.g., to turn off operation of the DC-DC converter 300 in response to a manual off input, to turn on operation of the DC-DC converter 300 in response to a manual turn on input, etc.).

In some embodiments, the controller may be configured to receive a remote on/off input to operate the DC-DC converter 300 according to a remote on/off input command, control, etc. For example, the controller may be in communication with a remote computing device via a wired connection, a wireless connection (e.g., cellular, WiFi, BLUETOOTH, etc.). The remote computing device can provide on/off control input to the controller to turn on and turn off operation of the DC-DC converter 300 remotely.

As another optional feature, the controller may provide monitoring and/or programming capability to another computing device (e.g., a computer, a cellular phone, another commercial off-the-shelf (COTS) device, etc.), a display on the DC-DC converter 300 itself, etc. For example, the controller may communicate with the computing device via a wired connection, a wireless connection, etc. as described above. The controller may provide status of monitored parameters of the DC-DC converter 300 to the computing device, etc. In some embodiments, the computing device may be able to program the controller, etc.

As shown in FIG. 3, the housing 302 includes alarm contacts 320. The alarm contacts 320 can be connected to standard alarm contacts (e.g., standard alarm pin locations, etc.) on a power panel, etc. to which the DC-DC converter 300 is coupled (i.e., via the DIN rail mount 304, etc.).

The DC-DC converter 300 may be configured to detect an alarm condition of the DC-DC converter 300 (e.g., due to a fault condition of the DC-DC converter 300, etc.), and the alarm contacts 320 can be configured to provide an alarm signal when the alarm condition is detected.

For example, a controller (e.g., controller 112 of FIG. 1, etc.) may be coupled to the alarm contacts 320, and be configured to provide an alarm signal to the alarm contacts 320 in response to detection of the alarm condition of the DC-DC converter 300. In some embodiments, the DC-DC converter 300 may have the capability to generate an alarm or not generate an alarm when the switch 318 is in an off or disable position.

The housing 302 may have package widths available in integer multiples of DIN rail circuit device poles. In some embodiments, the DC-DC converter described herein may include a flying lead 322 for facilitating connection to a return bus for a positive (+) or negative (−) voltage connection point.

The DC-DC converters described herein may include one or more visual indicators, such as an LED to show overcurrent conditions, open circuit conditions, device failure conditions, etc. The DC-DC converters may be UL listed, may be rated for operation up to sixty-five degrees Celsius (or higher), may meet FCC Class B standards, etc.

According to another example embodiment, a method of supplying power in a DC-DC power distribution system is disclosed. The DC-DC power distribution system includes one or more electronic communication devices, a circuit breaker DIN rail, and a DC-DC converter, the DC-DC converter includes a housing having a DIN rail mount, a voltage input and a voltage output. The DC-DC converter includes a DC-DC voltage converter circuit coupled between the voltage input and the voltage output, and a controller coupled with the DC-DC voltage converter circuit. The DC-DC converter is mounted on the circuit breaker DIN rail via the DIN rail mount of the DC-DC converter housing.

The example method includes receiving, at the voltage input of the DC-DC converter mounted on the circuit breaker DIN rail, a DC input voltage. The method also includes converting, by the DC-DC voltage converter circuit, the received DC input voltage to a different DC output voltage, and supplying, via the voltage output of the DC-DC converter mounted on the circuit breaker DIN rail, the converted DC output voltage to the one or more electronic communication devices. The method may include installing the DC-DC converter on the circuit breaker DIN rail by mounting the DIN rail mount of the DC-DC converter housing on the circuit breaker DIN rail.

In some embodiments, supplying the converted DC output voltage includes supplying the converted DC output voltage to wireless radio equipment located on a radio tower. In those cases, receiving the DC input voltage may include receiving the DC input voltage from a battery, a DC power system, etc., and supplying the converted DC output voltage may include supplying the converted DC output voltage to the wireless radio equipment from the DC power system rectifier(s) and/or the battery during a utility power outage.

According to another example embodiment, a DC-DC converter includes a housing having a DIN rail mount, a voltage input and a voltage output. The DIN rail mount is adapted to mount on a circuit breaker DIN rail of a DC-DC power distribution system. The DC-DC converter also includes a DC-DC voltage converter circuit coupled between the voltage input and the voltage output, and a controller coupled with the DC-DC voltage converter circuit. The controller is configured to control the DC-DC voltage converter circuit to convert a DC input received at the voltage input to a different DC voltage at the voltage output, to supply output power at the DC output voltage.

As described herein, example embodiments can combine functionality of an overcurrent protection device, a disconnect switch, a DC-DC voltage converter circuit, a power and/or current limiter circuit, etc. in a DC-DC converter package having a form factor of a DIN rail DC circuit breaker mounted on a circuit breaker DIN rail of a power system, so that the embodiments described herein can be used in any suitable DC power distribution system, etc. that incorporates DIN rail style circuit devices (e.g., DIN rail DC circuit breakers).

Example DC-DC converter described herein may be used in applications in which the DC power is delivered over long distances to the end load, etc. If the DC-DC converter has a DC output voltage that is regulated at a higher level than a DC input voltage, an end load can be sustained for a longer period of time during a battery discharge. The example DC-DC converters described herein may be suitable for meeting Class 2 circuit requirements, etc.

In one example, wireless service providers sometimes provide power radio equipment that is located on radio towers at various heights. Due to the cable loop length from the power system to the equipment, the DC voltage at the radio equipment is reduced and decreases during an AC outage (due to battery discharge). Wireless providers may deploy a stand-alone DC-DC converter system connected to an existing −48VDC rectifier/battery plant to raise the output voltage to the loads to allow the radios to sustain operation during an outage as well as reduce the size of the cable feeding the remote loads. In addition, distributed antenna system (DAS) providers are deploying a Class 2 circuit converter system that keeps each circuit power to a limit of 100VA. Installations of stand-alone converter systems require considerable extra expense as well as extra rack space. Example embodiments described herein may allow one or both of these functions to be implemented in existing power systems, reducing extra costs required as well as space required. Existing wiring could potentially be re-used, and labor required for installing a stand-alone converter plant could be reduced.

Example embodiments and aspects of the present disclosure may provide any one or more (or none) of the following advantages: DC-DC converters that are interchangeable with DIN rail DC circuit breakers having DIN rail mounts, combination of multiple DC-DC converter functions and features into a compact device, devices that can be used in equipment for multiple vendors, operability without requiring changes or modifications to existing equipment, communication with smartphones, etc.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A DC-DC power distribution system comprising:
one or more electronic communication devices;
a circuit breaker DIN rail adapted to receive a circuit breaker for providing electrical protection to the one or more electronic communication devices; and
a DC-DC converter including a housing having a DIN rail mount, a voltage input and a voltage output, the DC-DC converter including a DC-DC voltage converter circuit coupled between the voltage input and the voltage output, a controller electrically coupled with the DC-DC voltage converter circuit, a power or current limiter circuit coupled between the voltage input and the voltage output and configured to limit a DC output power or DC output current of the DC-DC converter to below a specified output power threshold or specified output current threshold, and an overcurrent protection circuit coupled between the voltage input and the voltage output and configured to protect the DC-DC converter from an overcurrent condition, wherein:
the DC-DC converter is mounted on the circuit breaker DIN rail via the DIN rail mount of the DC-DC converter housing; and
the controller is configured to control the DC-DC voltage converter circuit to convert a DC voltage at the voltage input to a different DC voltage at the voltage output to supply power to the one or more electronic communication devices at the DC output voltage.

2. The DC-DC power distribution system of claim 1, wherein:
the controller is coupled with the power or current limiter circuit and configured to control the power or current limiter circuit to limit the DC output power or DC output current of the DC-DC converter to below a specified output power threshold or specified output current threshold; or
the controller is coupled with the overcurrent protection circuit and configured to control the overcurrent protection circuit to protect the DC-DC converter from an overcurrent condition.

3. The DC-DC power distribution system of claim 1, wherein the controller is configured to operate the DC-DC voltage converter circuit to convert a DC input voltage within a specified voltage input range to a DC output voltage within a specified voltage output range.

4. The DC-DC power distribution system of claim 3, wherein the specified voltage input range is −36VDC to −58VDC.

5. The DC-DC power distribution system of claim 3, wherein the specified voltage output range is −48V to −72VDC.

6. The DC-DC power distribution system of claim 1, wherein the power or current limiter circuit is configured to limit the DC output power to below the specified output power threshold in a range of between 100 W and 2500 W.

7. The DC-DC power distribution system of claim 1, wherein the power or current limiter circuit is configured to limit the DC output current to below the specified output current threshold in a range of between 1 A and 50 A.

8. The DC-DC power distribution system of claim 1, wherein the overcurrent protection circuit is configured to protect the DC-DC converter from an overcurrent condition at a DC output current threshold in a range of between 1 A and 50 A.

9. The DC-DC power distribution system of claim 1, wherein the voltage input includes a DIN rail line terminal and the voltage output includes a DIN rail load terminal.

10. The DC-DC power distribution system of claim 1, wherein the housing has substantially the same form factor as a DIN rail circuit breaker.

11. The DC-DC power distribution system of claim 1, further comprising:
a current sense coupled to detect a DC input current or DC output current of the DC-DC converter; or
a voltage sense coupled to detect a DC input voltage of the DC-DC converter, a DC output voltage of the DC-DC converter, or a voltage on an input of a remote radio unit used to control the DC output voltage of the DC-DC converter.

12. The DC-DC power distribution system of claim 1, further comprising a fault protection circuit coupled between the voltage input and the voltage output, the fault protection circuit configured to create a physical disconnect between the voltage input and the voltage output when the overcurrent protection circuit is unable to sufficiently limit the output current.

13. The DC-DC power distribution system of claim 1, further comprising an alarm contact positioned on an outer portion of the housing, the alarm contact configured to transmit an alarm signal when an alarm condition of the DC-DC converter is detected.

14. The DC-DC power distribution system of claim 1, wherein:
the controller is configured to communicate with a computing device to allow the computing device to monitor or program the DC-DC converter; or
the controller is configured to disconnect at least one of the voltage input and the voltage output when a low-voltage condition is detected.

15. The DC-DC power distribution system of claim 1, wherein:
the controller is configured to receive a manual on/off input to control the DC-DC converter via a manual on/off operation control; or
the controller is configured to receive a remote on/off input to control the DC-DC converter via a remote on/off operation control.

16. A method of supplying power in a DC-DC power distribution system, the DC-DC power distribution system including one or more electronic communication devices, a circuit breaker DIN rail, and a DC-DC converter, the DC-DC converter including a housing having a DIN rail mount, a voltage input and a voltage output, the DC-DC converter including a DC-DC voltage converter circuit coupled between the voltage input and the voltage output, a controller coupled with the DC-DC voltage converter circuit, the DC-DC converter mounted on the circuit breaker DIN rail via the DIN rail mount of the DC-DC converter housing, a power or current limiter circuit coupled between the voltage input and the voltage output, and an overcurrent protection circuit coupled between the voltage input and the voltage output, the method comprising:
receiving, at the voltage input of the DC-DC converter mounted on the circuit breaker DIN rail, a DC input voltage;
converting, by the DC-DC voltage converter circuit, the received DC input voltage to a different DC output voltage;

supplying, via the voltage output of the DC-DC converter mounted on the circuit breaker DIN rail, the converted DC output voltage to the one or more electronic communication devices;

limiting, by the power or current limiter circuit, a DC output power or DC output current of the DC-DC converter to below a specified output power threshold or specified output current threshold; and inhibiting, by the overcurrent protection circuit, the DC-DC converter from maintaining an overcurrent condition.

17. The method of claim 16, wherein the one or more electronic communication devices include wireless radio device(s) located on a radio tower.

18. The method of claim 17, wherein:

receiving the DC input voltage includes receiving the DC input voltage from a battery or a DC power system; and supplying the converted DC output voltage includes supplying the converted DC output voltage to the wireless radio device(s) from the DC power system or the battery during a utility power outage.

19. The method of claim 16, further comprising installing the DC-DC converter on the circuit breaker DIN rail by mounting the DIN rail mount of the DC-DC converter housing on the circuit breaker DIN rail.

20. A DC-DC converter comprising:

a housing having a DIN rail mount, a voltage input and a voltage output, the DIN rail mount adapted to mount on a circuit breaker DIN rail of a DC-DC power distribution system;

a DC-DC voltage converter circuit coupled between the voltage input and the voltage output;

a power or current limiter circuit coupled between the voltage input and the voltage output and configured to limit a DC output power or DC output current of the DC-DC converter to below a specified output power threshold or specified output current threshold;

an overcurrent protection circuit coupled between the voltage input and the voltage output and configured to protect the DC-DC converter from an overcurrent condition; and a controller coupled with the DC-DC voltage converter circuit, the controller configured to control the DC-DC voltage converter circuit to convert a DC voltage received at the voltage input to a different DC voltage at the voltage output, to supply the DC output power at the DC output voltage.

* * * * *